(12) United States Patent
Thollin

(10) Patent No.: US 10,638,609 B2
(45) Date of Patent: Apr. 28, 2020

(54) THREE-DIMENSIONAL ELECTRICAL MODULE COMPRISING A DECOUPLING CAPACITOR

(71) Applicant: COMMISSARIAT A L'ENERGIE ATOMIQUE ET AUX ENERGIES ALTERNATIVES, Paris (FR)

(72) Inventor: Benoit Thollin, Meylan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/475,746

(22) PCT Filed: Jan. 3, 2018

(86) PCT No.: PCT/FR2018/050015
§ 371 (c)(1),
(2) Date: Jul. 3, 2019

(87) PCT Pub. No.: WO2018/127660
PCT Pub. Date: Jul. 12, 2018

(65) Prior Publication Data
US 2019/0335585 A1    Oct. 31, 2019

(30) Foreign Application Priority Data
Jan. 6, 2017    (FR) .................................... 17 50131

(51) Int. Cl.
*H05K 1/14* (2006.01)
*H05K 1/02* (2006.01)
*H05K 1/18* (2006.01)

(52) U.S. Cl.
CPC .......... *H05K 1/145* (2013.01); *H05K 1/0213* (2013.01); *H05K 1/182* (2013.01)

(58) Field of Classification Search
None
See application file for complete search history.

(56) References Cited

U.S. PATENT DOCUMENTS

| 6,418,029 B1 * | 7/2002 | McKee | H05K 1/023 174/260 |
|---|---|---|---|
| 9,793,251 B2 * | 10/2017 | Lee | H01L 23/3128 |
| 9,872,392 B2 * | 1/2018 | Shan | H05K 1/183 |
| 2003/0170931 A1 | 9/2003 | Hashimoto | |

(Continued)

OTHER PUBLICATIONS

International Search Report dated Mar. 19, 2018 in PCT/FR2018/050015 filed on Jan. 3, 2018.

*Primary Examiner* — Xanthia C Cunningham
(74) *Attorney, Agent, or Firm* — Oblon, McClelland, Maier & Neustadt, L.L.P.

(57) ABSTRACT

A three-dimensional electrical module includes first and second parallel substrates that each includes an electrical contact oriented toward the other of the first and second substrates. The electrical module also includes a capacitor including a first electrode electrically connected and securely fastened to the contact of the first substrate, and a second electrode electrically connected and securely fastened to the contact of the second substrate. Additionally, the electrical module includes a continuity of material being formed between the first and second substrates, perpendicular to the first and second substrates and through the capacitor.

8 Claims, 3 Drawing Sheets

(56) References Cited

U.S. PATENT DOCUMENTS

| | | |
|---|---|---|
| 2005/0184381 A1* | 8/2005 | Asahi ................ H01R 13/2414 |
| | | 257/693 |
| 2009/0102037 A1* | 4/2009 | Kim ................ H01L 23/49816 |
| | | 257/686 |
| 2012/0229948 A1 | 9/2012 | Sawyer et al. |
| 2014/0118882 A1 | 5/2014 | Masuda et al. |
| 2014/0262463 A1 | 9/2014 | Lee et al. |
| 2015/0366063 A1 | 12/2015 | Takagi et al. |

* cited by examiner

THREE-DIMENSIONAL ELECTRICAL MODULE COMPRISING A DECOUPLING CAPACITOR

The invention relates to power electronics, and in particular to the production of power electronic circuits of three-dimensional architecture and comprising surface mount components (SMCs). In particular, SMCs in general include decoupling capacitors having a first electrode at the potential of a first substrate and a second electrode at the potential of a second substrate.

In the example detailed in document US20150296623, a capacitor has its two electrodes electrically connected to two respective electrical contacts of the same substrate. The capacitor is positioned elongate, i.e. an axis connecting its two electrodes is parallel to the substrate. The electrical connection between each electrode and its respective electrical contact is achieved by way of a conductive frame a first end of which is soldered to a contact of the substrate and a second end of which is soldered to an electrode of the capacitor. The use of such metal frames allows thermomechanical stresses between the capacitor and the substrate, which may appear because of differences in the thermal expansion coefficients of the capacitor and the substrate, to be decreased.

If it were desired to create a three-dimensional architecture on the basis of this document, such a capacitor, if used as a decoupling capacitor, would thus be fastened to a first substrate by way of two metal frames, to two electrical contacts of this first substrate. A second substrate would be positioned parallel to the first substrate, and hence the capacitor would be interposed between the first and second substrates.

No satisfactory solution is known for connecting the potential of the second substrate to one of the electrodes of the capacitor without creating a short-circuit. Moreover, such an architecture would prove to be relatively voluminous, in particular when the potential difference between the substrates is great, as this would cause the distance between the substrates to be large. The voltage withstand between the second substrate and the electrode of the capacitor at the potential of the first substrate would then be ensured by the spacing between this electrode and the second substrate.

One solution has been proposed in the document 'Realization and characterization of an IGBT Module Based on the Power Chip-on-Chip 3D Concept' authored by Ms Marchesini et al, which proposes to mount a decoupling capacitor, associated with a half-bridge, on a third substrate. The first substrate comprises a diode and an IGBT transistor, the second substrate also comprises a diode and an IGBT transistor. This third substrate is placed between the first and second substrates and protrudes laterally. The capacitor is placed on the protrusion of the third substrate. The two faces of the third substrate are biased to different potentials, corresponding to the potentials of the first and second substrates.

Such an architecture has drawbacks. Specifically, interconnection induces parasitic cell inductances. When the decoupling capacitor is connected to other high-frequency components of one of the two substrates, these cell inductances may limit the performance of the electrical system, and in particular generate considerable electrical losses at high frequency. In addition, mechanical maintenance of the spacing between the two substrates might prove to be tricky to achieve.

The invention aims to solve one or more of these drawbacks. The invention thus relates to a three-dimensional electrical module, such as defined in claim 1.

The invention also relates to the variants defined in the dependent claims. Those skilled in the art will understand that each of the features of the variants of the dependent claims may be combined independently with the features of an independent claim, without however constituting an intermediate generalization.

Other features and advantages of the invention will become more clearly apparent from the description that is given thereof below, by way of completely nonlimiting indication, with reference to the appended drawings, in which.

The invention proposes to form a spacer between two substrates of a three-dimensional electrical module (in particular for a power module) by way of a decoupling capacitor. This decoupling capacitor comprises a first electrode electrically connected and securely fastened to a contact of the first substrate, and a second electrode electrically connected and securely fastened to a contact of the second substrate.

The connectors of such a decoupling capacitor thus have lower specific inductances (impacting the cell inductances) promoting high-frequency operation of the electrical module. Such a decoupling capacitor also participates in the mechanical resistance of the electrical module, in particular its resistance to a compression applied perpendicular to the two substrates.

Figure 1:
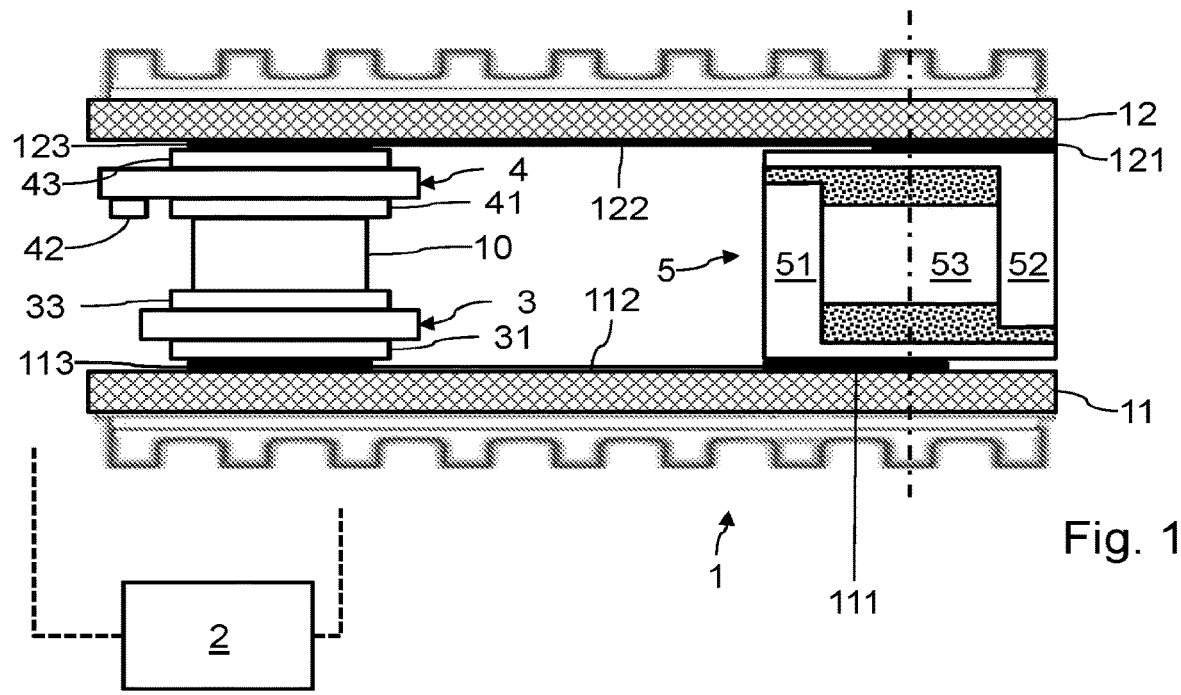
FIG. 1 is a schematic transverse cross-sectional view of an example of a three-dimensional electrical module according to one embodiment.

FIG. 1 is a transverse cross-sectional view of an example of a three-dimensional electrical module 1 according to one embodiment. The electrical module 1 is here illustrated for a particular application to an inverter. The electrical module comprises substrates 11 and 12 of a structure that is known per se. The substrates 11 and 12 are substantially planar and positioned parallel to each other. The substrate 11 comprises an upper face oriented toward the substrate 12 and comprising an electrical contact 111 oriented toward this substrate 12. The substrate 12 comprises a lower face oriented toward the substrate 11 and comprising an electrical contact 121 oriented toward the substrate 11. The contacts 111 and 121 are here offset in a direction parallel to the substrates 11 and 12. The direction normal to the substrates 11 and 12 is here illustrated by the straight dot-dashed line.

The electrical module 1 comprises a surface-mount capacitor 5 the structure of which will be described in more detail below. If the capacitance of the capacitor 5 is insufficient, it may be connected to another remote capacitor where appropriate. The capacitor 5 comprises a first electrode 51 and a second electrode 52, which electrodes are located at opposite axial ends of this capacitor 5. A body 53, the external portion of which is insulating, is placed between the electrodes 51 and 52. The electrode 51 is electrically connected and is securely fastened to the contact 111 of the substrate 11. The electrode 52 is electrically connected and is securely fastened to the contact 121 of the substrate 12. Thus, a supply potential of the substrate 11 may be directly applied to the electrode 51 without requiring any three-dimensional electrical interconnection with the substrate 12. Likewise, a supply potential of the substrate 12 may be directly applied to the electrode 52 without requiring any three-dimensional electrical interconnection with the substrate 11. The cell inductance of the electrical module 1 may thus be decreased. The electrodes 51 and 52 may be electrically connected and fastened to the contacts 111 and 121, respectively, by way of solder joints or brazed joints or by sintering or by conductive adhesive. Moreover, an optimal distance is maintained between the potential of the electrical contact 111 and the electrode 52 on the one hand, and the potential of the electrical contact 121 and the electrode 51 on the other hand, this promoting resistance to a breakdown voltage: the breakdown voltage of the capacitor 5 thus dimensions the breakdown voltage of the electrical module 1 (at least in the zone of the capacitor).

As illustrated in FIG. 1, a continuity of material is formed between the substrates 11 and 12 along an axis perpendicular to the substrates 11 and 12, which axis is illustrated by the dot-dashed line. Specifically, the continuity of material is here formed between the electrical contacts 111 and 121, by way of the electrode 51, of the body 53 and of the electrode 52. The capacitor 5 therefore here forms a spacer between the substrates 11 and 12, participating in the resistance to compression between these substrates 11 and 12 in their perpendicular direction. The capacitor 5 is here positioned parallel to the substrates 11 and 12, i.e. its electrodes 51 and 52 are aligned perpendicular to the dot-dashed axis.

The capacitor 5 is here a decoupling capacitor between the substrates 11 and 12. The electrodes 51 and 52 are thus intended to receive different supply potentials applied to the substrates 11 and 12, respectively. In particular, the electrical module 1 is associated with a supply circuit 2, configured to apply distinct potentials to the electrical contacts 111 and 121 of the substrates 11 and 12, respectively.

The substrate 11 furthermore comprises another electrical contact 113 that is offset laterally with respect to the contact 111. The electrical contacts 111 and 113 are electrically connected by way of a conductive track 112. An electronic component 3 is here electrically connected to the electrical contact 113. The electronic component 3 is in the present case a diode.

The substrate 12 furthermore comprises another electrical contact 123 that is offset laterally with respect to the contact 121. The electrical contacts 121 and 123 are electrically connected by way of a conductive track 122. An electronic component 4 is here electrically connected to the electrical contact 123. The electronic component 4 is in the present case an IGBT transistor. The components 3 and 4 are for example intended to form a half-bridge circuit, as in the example schematically illustrated in FIG. 2.

The contacts 113 and 123 and the components 3 and 4 are aligned along an axis perpendicular to the substrates 11 and 12.

The anode 31 of the diode 3 is electrically connected and fastened to the electrical contact 113. This electrical contact 113 is raised to a supply potential of the substrate 11. The diode 3 comprises a cathode 33. The cathode 33 is electrically connected to a contact of an AC voltage output 10. The contact 10 is interposed between the diode 3 and the IGBT transistor 4.

The drain 43 of the IGBT transistor 4 is electrically connected and fastened to the electrical contact 123. This electrical contact 123 is raised to a supply potential of the substrate 12. The IGBT transistor 4 comprises a control gate 42 that is controlled in a way known per se by a control circuit (not illustrated). The transistor 4 comprises a source 41. The source 41 is electrically connected to the AC voltage output contact 10.

Figure 2:
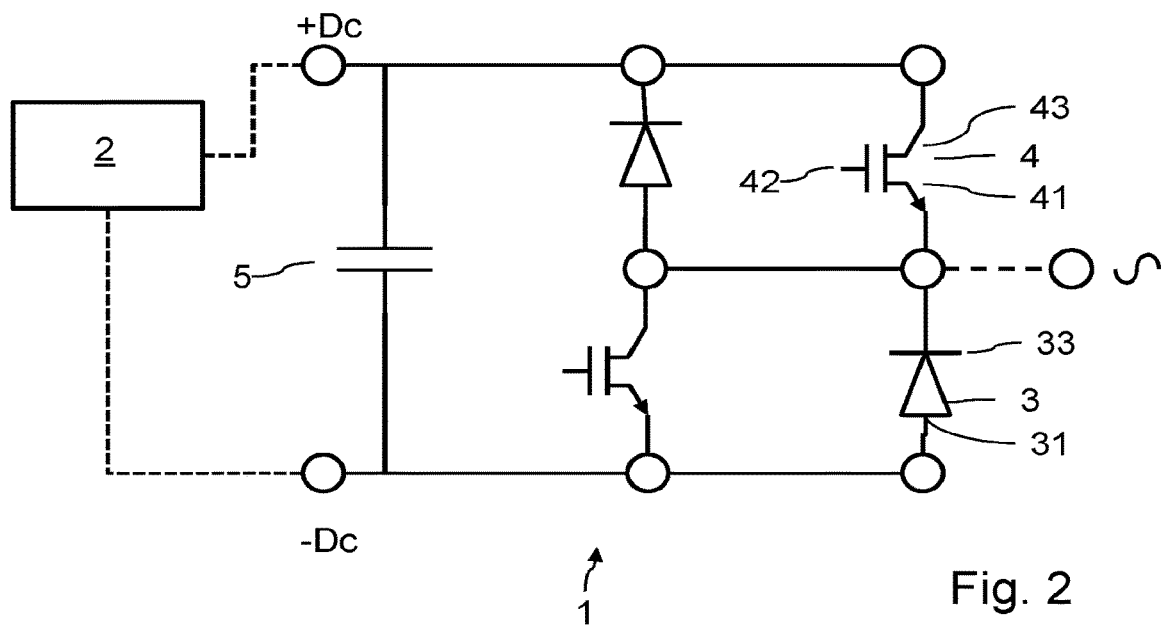
FIG. 2 is an equivalent circuit diagram of the electrical module of FIG. 1.

The equivalent circuit diagram of the electrical module 1 completed to form a half-bridge is illustrated in FIG. 2. The supply circuit 2 applies a voltage +Dc to the drain 43 and to the electrode 52, and a voltage −Dc to the source 31 and to the electrode 51. Such an inverter application in practice proves to be particularly compact and optimized for limiting parasitic cell inductances. The invention thus proves to be particularly advantageous for switching components employing high frequencies (for example typically at least equal to 100 kHz) and/or high voltages (for example typically at least equal to 100 V), domains of application of predilection for IGBTs, MOSFETs or high-electron-mobility transistors. The invention also proves to be advantageous at low frequencies, as it decreases over-voltages and undulations.

Figure 3:
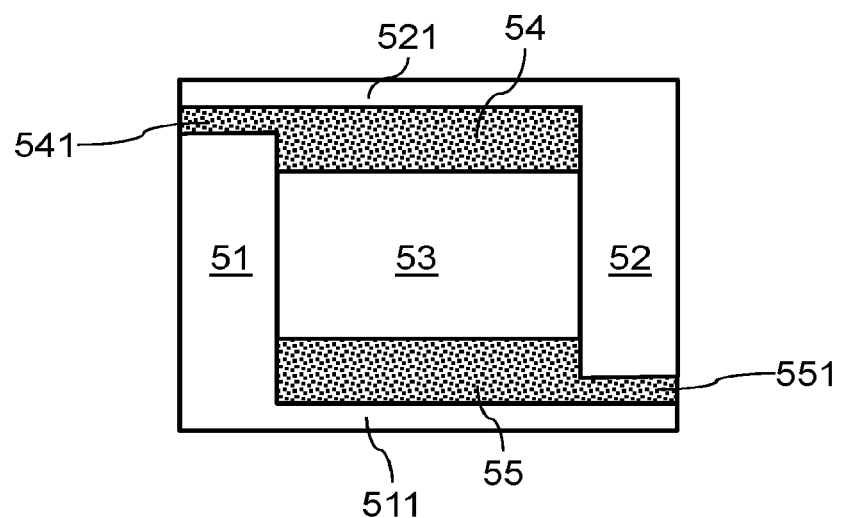
FIG. 3 is a longitudinal cross-sectional view of an example of a capacitor for the embodiment in FIG. 1.

FIG. 3 is a longitudinal cross-sectional view of a capacitor 5 for forming a three-dimensional electrical module 1 such as illustrated in FIG. 1. The capacitor 5 is here configured to advantageously be positioned parallel to the substrates 11 and 12. The bulk of a capacitor 5 generally being larger in its axial direction than in its transverse direction, positioning it thus advantageously allows the bulk of the electrical module 1 in a direction perpendicular to the substrates 11 and 12 to be decreased, by decreasing the distance between the substrates 11 and 12.

For example, for a capacitor 5 having a breakdown voltage of 1000 V, it is possible to envision that it has a length of 2.1 mm between these electrodes 51 and 52, and an electrode height of 1.4 mm. Even though dielectric material is interposed between the electrodes of the capacitor 5 and the substrates 11 and 12, such a configuration allows the bulk of the electrical module 1 to be decreased in a direction perpendicular to the substrates 11 and 12.

The capacitor 5 comprises a first electrode 51 and a second electrode 52. The electrode 51 comprises an axial end, and a lateral extension 511. The electrode 52 comprises an axial end, and a lateral extension 521. The respective axial ends of the electrodes 51 and 52 are positioned axially on either side of a body 53, at least the external surface of which is insulating. The lateral extensions 511 and 521 extend laterally on either side along the body 53. In this example, the lateral extension 511 extends up to the side of the electrode 52. In this example, the lateral extension 521 extends up to the side of the electrode 51. The electrical connection and the fastening of the electrode 51 to a conductive contact of the substrate 11 is intended to be achieved by way of the lateral extension 511. The electrical connection and fastening of the electrode 52 to a conductive contact of the substrate 12 is intended to be achieved by way of the lateral extension 521.

The capacitor 5 furthermore comprises a dielectric material 54 interposed between the body 53 and the lateral extension 521. The dielectric material 54 also comprises an extension 541 interposed between the lateral extension 521 and the electrode 51. The extension 541 therefore allows the electrode 51 to be electrically insulated with respect to the lateral extension 521 and with respect to the substrate 12.

The capacitor 5 furthermore comprises a dielectric material 55 interposed between the body 53 and the lateral extension 511. The dielectric material 55 also comprises an extension 551 interposed between the lateral extension 511 and the electrode 52. The extension 551 therefore allows the electrode 52 to be electrically insulated with respect to the lateral extension 511 and with respect to the substrate 11.

Such a capacitor 5 allows the electrical contact between the electrodes 51 and 52 and their respective electrical contacts of the substrates 11 and 12 to be improved, and allows the resistance to compression applied perpendicularly between the substrates 11 and 12 to be improved. Furthermore, such a capacitor 5 is suitable for having the deposition of the dielectric materials 54 and 55 achieved by processes such as PECVD during its manufacture. The dielectric materials thus deposited may have a very high dielectric strength, allowing the thickness of the dielectric materials 54 and 55 to be decreased. Moreover, by integrating such dielectric materials 54 and 55 into the manufacturing process of the capacitor 5, the structure and the geometry of these dielectric materials 54 and 55, and therefore the breakdown voltage between the electrodes 51 and 52, are particularly well controlled. Moreover, because of the geometry of the electrodes 51 and 52, such a capacitor 5 intrinsically includes metal frames integrated into its electrodes 51 and 52. The electrodes 51 and 52 may be at least partially formed by a metallization of the dielectric materials 54 and 55.

In the example of FIG. 1:
the lateral extension 511 is soldered to the contact 111 of the substrate 11;
the lateral extension 521 is soldered to the contact 121 of the substrate 12.

Figure 4:
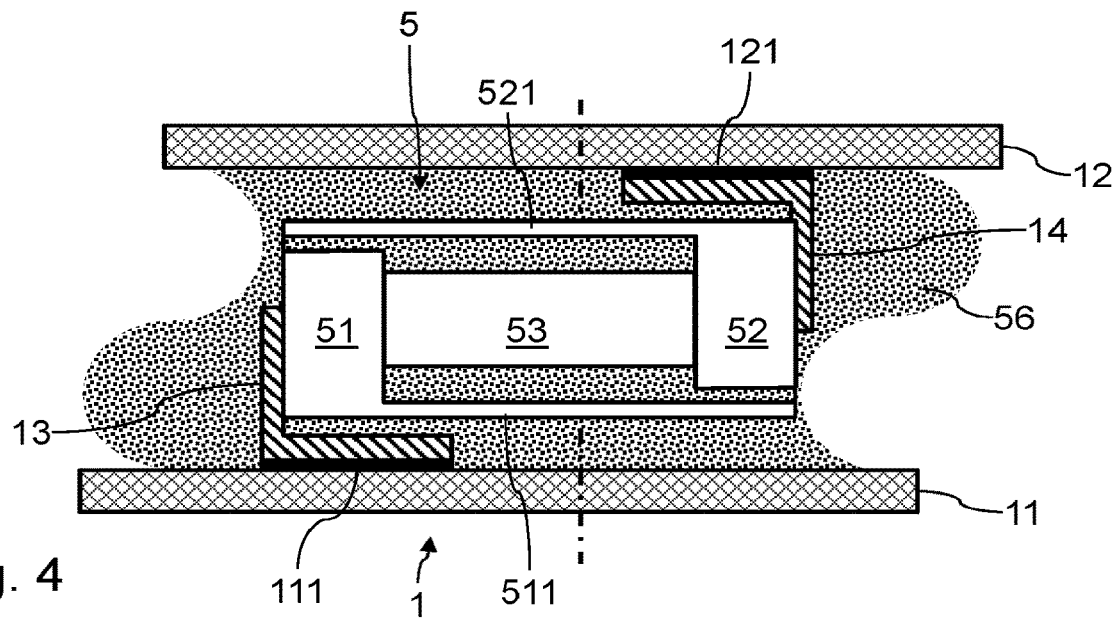
FIG. 4 is a schematic transverse cross-sectional view of an example of an electrical module according to one variant.

FIG. 4 is a transverse cross-sectional view of an example of a three-dimensional electrical module 1 according to one variant. Even though the electrodes 51 and 52 of the capacitor 5 of FIG. 3 play the role of metal frames, it is also possible to envision electrically connecting and securely fastening the capacitor 5 to the substrates 11 and 12 by way of additional metal frames.

The electrode 51 is here electrically connected and securely fastened to the contact 111 of the substrate 11, by way of a metal frame 13. The metal frame 13 may be soldered on the one hand to the contact 111, and on the other hand to an end face of the electrode 51. The electrode 52 is electrically connected and is securely fastened to the contact 121 of the substrate 12, by way of a metal frame 14. The metal frame 14 may be soldered or brazed on the one hand to the contact 121, and on the other hand to an end face of the electrode 52. The use of metal frames 13 and 14 allows potential deformations related to differences in thermal expansion coefficients or to geometric dispersions to be absorbed.

A dielectric material 56 is positioned at least on the side of the electrical contacts 111 and 121, in order to be interposed between the electrode 51 and the substrate 12 on the one hand, and between the electrode 52 and the substrate 11 on the other hand. The dielectric material 56 is solid, in order to ensure transverse mechanical maintenance. Moreover, the dielectric material 56 is also interposed between a lateral face of the electrode 51 and a wall of the metal frame 13 parallel to the substrate 11. Thus, the electrode 51 is fastened to a jamb of the frame 13, extending along the normal to the substrate 11 but is spaced apart from a jamb of the frame 13 parallel to this substrate 11. Moreover, the dielectric material 56 is also interposed between a lateral face of the electrode 52 and a wall of the metal frame 14 parallel to the substrate 12. Thus, the electrode 52 is fastened to a jamb of the frame 14, extending along the normal to the substrate 12, but is spaced apart from a jamb of the frame 14 parallel to this substrate 12.

A continuity of material through the capacitor 5 is thus obtained perpendicular to the substrate 11 and 12, for example through:
an axis passing through the dielectric material 56, the extension 521, the dielectric material 54, the body 53, the dielectric material 55, the extension 511 then the dielectric material 56;
an axis passing through the dielectric material 56, the extension 521, the dielectric material 54, the electrode 51 and one wall of the frame 13;
an axis passing through the wall of the frame 14, the electrode 52, the dielectric material 55, the extension 511 then the dielectric material 56.

The dielectric material 56 is for example a dielectric material for filling between the substrates 11 and 12.

The capacitor 5 therefore here forms a spacer between the substrates 11 and 12, participating in the resistance to compression between the substrates 11 and 12 in their perpendicular direction.

With a dielectric gel made of encapsulation silicone such as that sold by the company Quantum Silicones under the trade reference Qsil550, a thickness of 57 μm is sufficient between a substrate and an electrode of the capacitor 5 to resist a breakdown voltage of 1000 V. It is possible to choose a dielectric filling material that is rigid at room temperature (in order to guarantee a mechanical withstand of the dielectric materials 54 and 55), or compressible if it is desired to provide the structure with a certain flexibility.

Mention may be made of a certain number of dielectric materials and their properties with a view to producing the dielectric materials 54 and 55 (or 56 for the preceding variant). The choice of the materials will possibly also be made depending on the temperature behavior of the material, depending on the applications targeted for the capacitor 5.

| | Materials | Dielectric strength kV/mm | Distance for a breakdown voltage of 1000 V |
|---|---|---|---|
| Dielectric gels | Qsil 550 Quantum Silicones | 17.5 | 57.1 μm |
| | Qsil 1000 Quantum Silicones | 18 | 55.6 μm |
| | Duraseal 1533 Cotronics Corp | 19.7 | 50.8 μm |
| | Sylgard 527 Dow Corning | 15 | 66.7 μm |
| | Nusil R-21060 Nusil | 20 | 50 μm |
| | Qsil 550 Quantum Silicones | 17.5 | 57.1 μm |
| Ceramics | AlN | 15 | 66.7 μm |
| | BeO | 12 | 83.3 μm |
| | $Si_3N_4$ | 14.8 | 67.6 μm |
| | $Al_2O_3$ | 13 | 76.9 μm |
| Various | Duralco 4703 epoxy resin | 20 | 50 μm |
| | Polyimide | 28 | 35.7 μm |
| | PECVD $SiO_2$ | 600 | 1.7 μm |
| | PECVD $Si_3N_4$ | 1000 | 1 μm |

Figure 5:
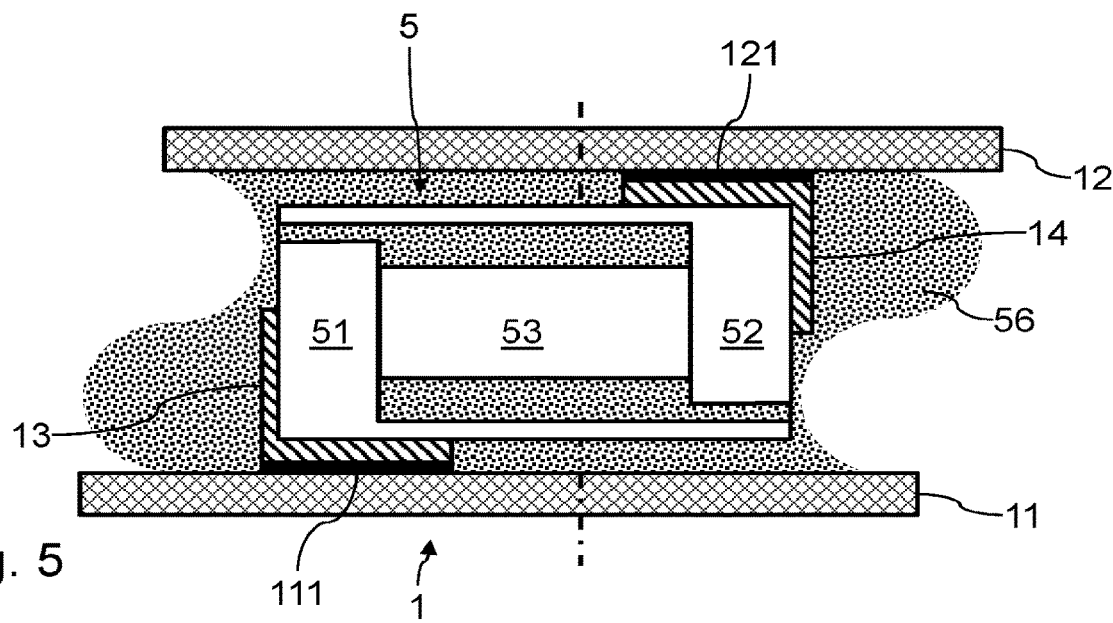
FIG. 5 is a schematic transverse cross-sectional view of an example of an electrical module according to another variant.

FIG. 5 is a transverse cross-sectional view of an example of a three-dimensional electrical module 1 according to another variant. This variant differs from that of FIG. 4 only in the following features:
the electrode 51 is pressed against the wall of the metal frame 13 parallel to the substrate 11;
no dielectric material 56 is interposed between the electrode 51 and the metal frame 13;

the electrode 52 is pressed against the wall of the metal frame 14 parallel to the substrate 12;

no dielectric material 56 is interposed between the electrode 52 in the metal frame 14.

The invention claimed is:

1. A three-dimensional electrical module, comprising:
   first and second parallel substrates, each of said first and second substrates comprising an electrical contact oriented toward the other of said first and second substrates;
   a capacitor comprising:
      a first electrode electrically connected and securely fastened to the contact of the first substrate, and
      a second electrode electrically connected and securely fastened to the contact of the second substrate;
   a continuity of material being formed between the first and second substrates, perpendicular to the first and second substrates, and through said capacitor; and
   an insulating body placed between the first and second electrodes, said continuity of material being formed through said insulating body,
   wherein the contacts of the first and second substrates are offset in a direction parallel to the first and second substrates, the first electrode comprising an axial end and the second electrode comprising an axial end, said insulating body being placed between the axial ends of the first and second electrodes, the first electrode comprising a lateral extension that extends laterally along the body, the second electrode comprising a lateral extension extending laterally along the body opposite to the lateral extension of the first electrode, the capacitor comprising a dielectric material interposed between the body and the lateral extension of the first electrode and comprising a dielectric material interposed between the body and the lateral extension of the second electrode.

2. The three-dimensional electrical module as claimed in claim 1, further comprising an electronic component,
   wherein the first substrate comprises a conductive track electrically connecting the electronic component and the first electrode of the capacitor.

3. The three-dimensional electrical module as claimed in claim 1, further comprising a supply circuit configured to apply distinct potentials to the electrical contacts of the first and second substrates.

4. The three-dimensional electrical module as claimed in claim 1, wherein the contacts of the first and second substrates are offset in a direction parallel to the first and second substrates, a dielectric material being interposed, on the side of the contact of the first substrate, between said second electrode and at said first substrate.

5. The three-dimensional electrical module as claimed in claim 4, further comprising:
   a first metal frame soldered to the contact of the first substrate and to the first electrode, and
   a second metal frame soldered to the contact of the second substrate and to the second electrode.

6. The three-dimensional electrical module as claimed in claim 5, wherein one portion of said dielectric material is also interposed between the contact of the first substrate and the first electrode.

7. The three-dimensional electrical module as claimed in claim 1, wherein:
   the lateral extension of the first electrode extends to the side of the second electrode,
   a dielectric material is interposed between the second electrode and the lateral extension of the first electrode,
   the lateral extension of the second electrode extends to the side of the first electrode, and
   a dielectric material is interposed between the first electrode and the lateral extension of the second electrode.

8. The three-dimensional electrical module as claimed in claim 1, wherein:
   the first electrode includes a metal layer formed on said dielectric material interposed between the body and the lateral extension of the first electrode, and
   the second electrode includes a metal layer formed on said dielectric material interposed between the body and the lateral extension of the second electrode.

* * * * *